(12) United States Patent
Wan et al.

(10) Patent No.: US 12,543,437 B2
(45) Date of Patent: Feb. 3, 2026

(54) DISPLAY PANEL AND DISPLAY DEVICE

(71) Applicants: Chongqing BOE Optoelectronics Technology Co., Ltd., Chongqing (CN); BOE TECHNOLOGY GROUP CO., LTD., Beijing (CN)

(72) Inventors: Bin Wan, Beijing (CN); Xiaoyuan Wang, Beijing (CN); Zhe Li, Beijing (CN); Xun Pu, Beijing (CN); Junming Chen, Beijing (CN); Guodong Yang, Beijing (CN)

(73) Assignees: Chongqing BOE Optoelectronics Technology Co., Ltd., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 391 days.

(21) Appl. No.: 18/027,911

(22) PCT Filed: Mar. 31, 2022

(86) PCT No.: PCT/CN2022/084336
§ 371 (c)(1),
(2) Date: Mar. 22, 2023

(87) PCT Pub. No.: WO2023/184314
PCT Pub. Date: Oct. 5, 2023

(65) Prior Publication Data
US 2024/0315075 A1    Sep. 19, 2024

(51) Int. Cl.
*H10K 59/121*   (2023.01)
*H10K 59/131*   (2023.01)
*H10K 59/65*    (2023.01)

(52) U.S. Cl.
CPC ......... *H10K 59/121* (2023.02); *H10K 59/131* (2023.02); *H10K 59/65* (2023.02)

(58) Field of Classification Search
CPC .......................... H10K 59/121; H10K 59/131
See application file for complete search history.

(56) References Cited

U.S. PATENT DOCUMENTS

2022/0045042 A1    2/2022  Kim et al.
2022/0344415 A1*  10/2022  Jian ..................... H10K 59/121

FOREIGN PATENT DOCUMENTS

CN    109389909 A    2/2019
CN    111221163 A    6/2020
(Continued)

*Primary Examiner* — Douglas M Menz
(74) *Attorney, Agent, or Firm* — HOUTTEMAN LAW LLC

(57) ABSTRACT

The disclosure provides a display panel and a display device, and belongs to the technical field of display. The disclosure provides a display panel including a central display region and a bent display region at an edge of the central display region. The central display region is provided with a plurality of first pixels, and the bent display region is provided with a plurality of second pixels. A number of second pixels in a unit area is greater than a number of first pixels in the unit area. In the display panel, the PPI of the bent display region is higher than that of the central display region, so the number of the second pixels for gray-scale transition in the bent display region is increased, the gray-scale transition in the bent display region is uniform, and the aliasing phenomenon at the edge of the bent display region is improved.

14 Claims, 7 Drawing Sheets

(a)

(b)

(56) References Cited

FOREIGN PATENT DOCUMENTS

| | | |
|---|---|---|
| CN | 111261029 A | 6/2020 |
| CN | 112150916 A | 12/2020 |

\* cited by examiner (a)

(b)

(a)

(b)

DISPLAY PANEL AND DISPLAY DEVICE

TECHNICAL FIELD

The present disclosure relates to the technical field of display, and in particular, to a display panel and a display device.

BACKGROUND

With the development of information technology, display panels are widely used in daily life of people. The display panel has a rectangular display region with rounded corners, that is, the display region includes a central display region and bent display regions located at four corners of the central display region. At present, the bending edges are formed in a gray-scale transition way such that the gray-scale luminance of the pixels in the bent display regions gradually decreases in a direction from the central display region to a region away from the central display region. In the display panel with low pixels per inch (PPI), since a size of the pixel is large and a distance between the pixels is large, the number of a plurality of pixels for gray-scale transition is small and in turn the span of the gray scale is large, thereby resulting in an obvious aliasing phenomenon and a poor gray-scale transition at the edges of the bent display regions.

SUMMARY

In order to solve at least one of the technical problems existing in the prior art, the present disclosure provides a display panel and display device that can increase the density of the pixels in the bent display region, realize a uniform gray-scale transition from a central display region to a bent display region, and improve the aliasing phenomenon at the edge of the bent display region.

As a first aspect, the technical solution adopted to solve the technical problem of the present disclosure provides a display panel including a central display region and a bent display region at an edge of the central display region. The central display region is provided therein with a plurality of first pixels, and the bent display region is provided therein with a plurality of second pixels: wherein a number of the second pixels in a unit area is greater than a number of the first pixels in the unit area.

In some embodiments, each of the plurality of first pixels includes a plurality of first sub-pixels in different colors, and each of the plurality of second pixels includes a plurality of second sub-pixels in different colors, the plurality of first pixels are arranged in an array along a row direction as a first direction and a column direction as a second direction, the plurality of first sub-pixels in each of the first pixels are arranged in sequence along the first direction, with the first direction intersecting the second direction. The plurality of second pixels are arranged in an array along the row direction as the first direction and the column direction as the second direction, the plurality of second sub-pixels in each of the first pixels are arranged in sequence along the first direction, and an area occupied by each of the first sub-pixels is the same as an area occupied by n×m second sub-pixels, where n is a number of the second sub-pixels arranged in the first direction, m is a number of the second sub-pixels arranged in the second direction, with n being an integer greater than 1 and m being an integer greater than 1.

In some embodiments, a line passing through a midpoint of a line segment connecting central points of two second pixels adjacent in the first direction and extending in the second direction is a center line, and the second sub-pixels of the two second pixels symmetrical about the center line have a same color.

In some embodiments, n=m=2, and each of the second pixels includes one second sub-pixel in a first color, one second sub-pixel in a second color, and one second sub-pixel in a third color.

In some embodiments, an arrangement sequence for the six second sub-pixels of two second pixels adjacent in the first direction is the second sub-pixel in the first color, the second sub-pixel in the third color, the second sub-pixel in the second color, the second sub-pixel in the second color, the second sub-pixel in the third color, and the second sub-pixel in the first color.

In some embodiments, the display panel further includes a plurality of gate lines extending in the first direction and spaced apart from each other: wherein the first sub-pixels of one row of first pixels are connected to a corresponding one of the gate lines, a region defined in the bent display region by a first connection line on a first side and a second connection line on a second side of the first sub-pixels of the row of first pixels is provided therein with n rows of second pixels, the gate line connected to the first sub-pixels of the row of first pixels extends to the bent display region and is connected to the second sub-pixels of the n rows of second pixels, with each of the first connection line and the second connection line extending along the first direction, and the first side is opposite to the second side.

In some embodiments, n=2, one of the gate lines includes a first gate sub-line, a second gate sub-line, a third gate sub-line extending in the first direction, and a first connection line extending in the second direction, the first sub-pixels of one row of first pixels are connected to the first gate sub-line in the central display region, the second sub-pixels of two rows of second pixels corresponding to the row of first sub-pixels are respectively connected to the second gate sub-line and the third gate sub-line in the bent display region, and the first connection line is on a side of the two rows of second pixels away from the central display region, a first end of one of the second gate sub-line and the third gate sub-line is connected to a first end of the first gate sub-line, a second end of the one of the second gate sub-line and the third gate sub-line is connected to a first end of the first connection line, and a second end of the first connection line is connected to a first end of the other of the second gate sub-line and the third gate sub-line.

In some embodiments, the display panel further includes a plurality of data lines extending in the second direction and spaced apart from each other: wherein each column of first pixels includes k columns of first sub-pixels in different colors, k being an integer larger than 2, the first sub-pixels in each of the k columns of first sub-pixels are connected to a corresponding one of the plurality of data lines, and the first sub-pixels connected to a same data line have a same color, a region defined in the bent display region by a third connection line and a fourth connection line is provided therein with k×m columns of second sub-pixels, wherein the third connection line is on a third side of a 1st column of first sub-pixels away from a kth column of first sub-pixels among the k columns of first sub-pixels of the one column of first pixels, and the fourth connection line is on a fourth side of the kth column of first sub-pixels away from the 1st column of first sub-pixels, and the data line connected to any one of the k columns of first sub-pixels extends to the bent display region and is connected to m columns of second sub-pixels in the same color as the column of first sub-pixels, with each of the third connection line and the fourth connection line extending along the second direction and the third side being opposite to the fourth side.

In some embodiments, k=3, m=2, each column of first pixels includes one column of first sub-pixels in a first color, one column of first sub-pixels in a second color, and one column of first sub-pixels in a third color arranged in an order of the first sub-pixel in the first color, the second color in the first sub-pixel, and the first sub-pixel in the third color: each column of second pixels includes one column of second sub-pixels in the first color, one column of second sub-pixels in the second color, and one column of second sub-pixels in the third color, and an arrangement sequence of six columns of second sub-pixels in two adjacent columns of second pixels is the second sub-pixel in the first color, the second sub-pixel in the third color, the second sub-pixel in the second color, the second sub-pixel in the second color, the second sub-pixel in the third color, and the second sub-pixel in the first color. A region defined in the bent display region by a third connection line and a fourth connection line is provided therein with six columns of second sub-pixels of two adjacent columns of second pixels, wherein the third connection line is on a third side of the first sub-pixel in the first color away from the first sub-pixel in the third color among the three columns of first sub-pixels of one column of first pixels, and the fourth connection line is on a fourth side of the first sub-pixel in the third color away from the first sub-pixel in the first color. Among the three columns of first sub-pixels of the one column of first pixels, the data line connected to the first sub-pixels in the first color extends to the bent display region and is connected to two columns of second sub-pixels in the first color of the six columns of second sub-pixels, the data line connected to the first sub-pixels in the second color extends to the bent display region and is connected to two columns of second sub-pixels in the second color of the six columns of second sub-pixels, and the data line connected to the first sub-pixel in the third color extends to the bent display region and is connected to two columns of second sub-pixels in the third color of the six columns of second sub-pixels.

In some embodiments, one of the data lines includes a first data sub-line, a second data sub-line, a third data sub-line extending in the second direction, and a second connection line extending in the first direction. Among three columns of first sub-pixels of one column of first pixels, the first sub-pixels in one column of first sub-pixels in any color are connected to the first data sub-line in the central display region, and two columns of second sub-pixels in a same color corresponding to the column of first sub-pixels are respectively connected to the second data sub-line and the third data sub-line in the bent display region: the second connection line is on a side of the two columns of second sub-pixels in the same color away from the central display region. A first end of one of the second data sub-line and the third data sub-line is connected to a first end of the first data sub-line, a second end of the one of the second data sub-line and the third data sub-line is connected to a first end of the second connection line, and a second end of the second connection line is connected to a first end of the other of the second data sub-line and the third data sub-line.

In some embodiments, an aperture area of the second pixel is smaller than an aperture area of the first pixel: the farther the second pixel is from the first pixel along the first direction, the smaller the aperture area of the second pixel is; and the farther the second pixel is from the first pixel along the second direction, the smaller the aperture area of the second pixel is.

In some embodiments, the display panel further includes a light shielding layer covering a light-emitting side of the second pixel and the first pixel, wherein the farther the second pixel is from the first pixel along the first direction, the larger the area of the light shielding layer in the pixel region of the second pixel is, and the farther the second pixel is from the first pixel along the second direction, the larger the area of the light shielding layer in the pixel region of the second pixel is.

In some embodiments, the second sub-pixels of each of the second pixels have a same aperture area.

In some embodiments, the bent display region includes at least one of a fillet display region, a chamfer display region, and an arc-shaped display region.

As a second aspect, the present disclosure provides a display device including the display panel described above.

According to the display panel and the display device in the present disclosure, the PPI of the bent display region is higher than that of the central display region, so that the number of the second pixels for gray-scale transition in the bent display region can be increased, the gray-scale transition in the bent display region is uniform, and the aliasing phenomenon at the edge of the bent display region can be improved.

DETAIL DESCRIPTION OF EMBODIMENTS

Figure 1:
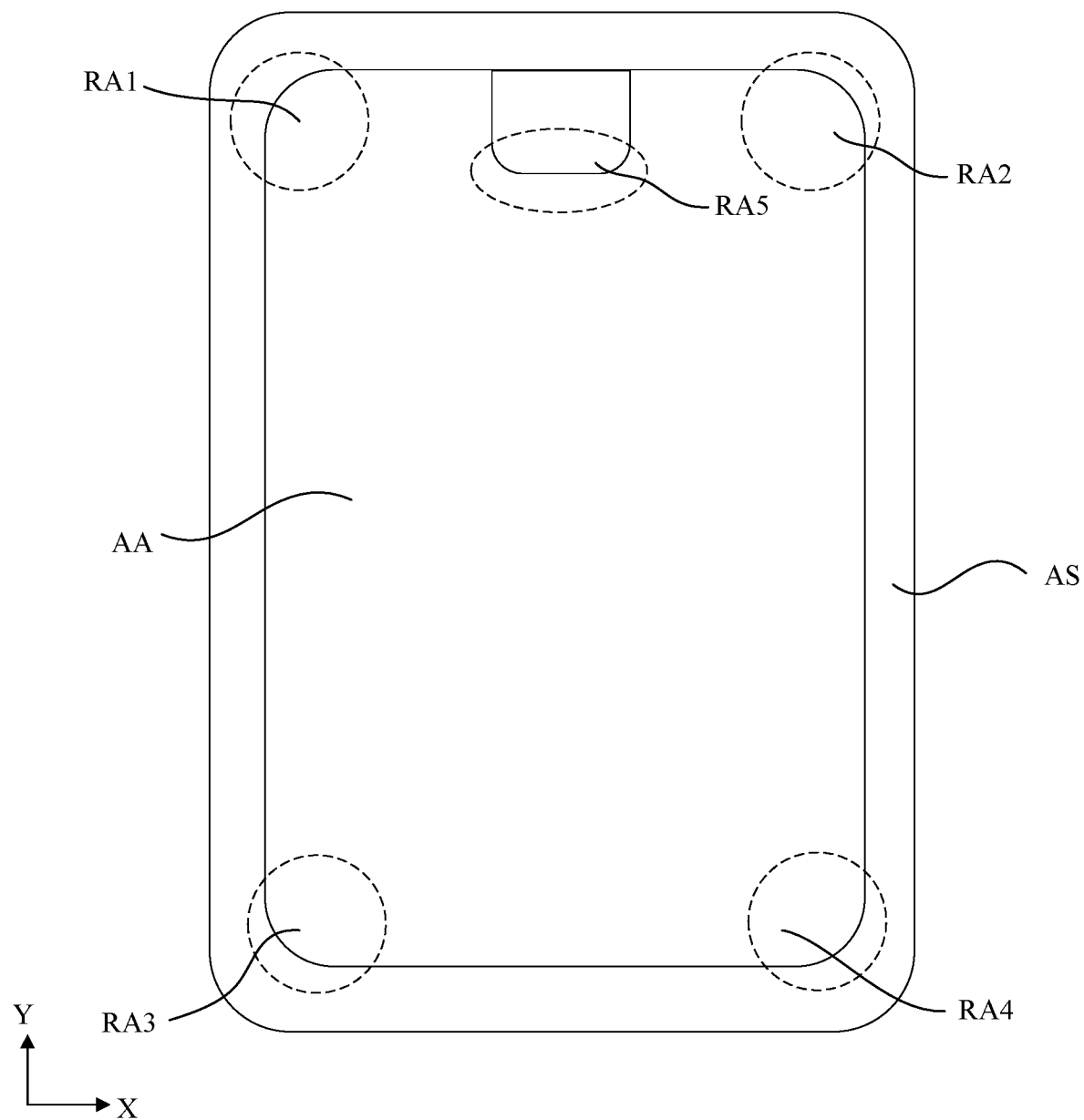
FIG. 1 is a schematic diagram showing a display region of a display panel.

Unless defined otherwise, technical or scientific terms used herein shall have the ordinary meaning as understood by one of ordinary skill in the art to which the present disclosure belongs. The use of "first," "second," and the like in the present disclosure is not intended to indicate any order, quantity, or importance, but rather is used to distinguish one element from another. Also, the use of the terms "a" "an" or "the" and similar referents do not denote a limitation of quantity, but rather denote the presence of at least one. The word "include" or "comprise", and the like, means that the element or item preceding the word comprises the element or item listed after the word and its equivalent, but does not exclude other elements or items. The terms "connect" or "couple" and the like are not restricted to physical or mechanical connections, but may include electrical connections, whether direct or indirect. "Upper", "lower", "left", "right", and the like are used only to indicate relative positional relationships, and when the absolute position of the object being described is changed, the relative positional relationships may also be changed accordingly.

In the present disclosure, the two structures are "disposed in the same layer", which means that the two structures are formed of the same material layer, and thus the two structures are in the same layer in the stacking relationship, but it does not mean that the two structures are equidistant from the base substrate, nor mean that other layers between the base substrate and the two structures are completely the same.

The present disclosure will be described in more detail below with reference to the accompanying drawings. Like elements are denoted by like reference numerals throughout the various figures. For purposes of clarity, the various features in the drawings are not drawn to scale. Moreover, certain well-known elements may not be shown in the figures.

In the present disclosure, a first direction X is an arbitrary direction, a second direction Y is an arbitrary direction, and the first direction X intersects the second direction Y. The following embodiments in which the first direction X is a row direction of an array including first pixels and/or second pixels arranged in the array and the second direction Y is a column direction of the array including the first pixels and/or the second pixels will be illustrated as examples, but the present disclosure is not limited thereto.

It should be noted that in the drawings, in order to present the position relationship of the layers, a semitransparent drawing process is applied to a part of the layers, but which does not mean that the actual structures of those layers are transparent, i.e. the present disclosure does not limit the material of the layers.

Figure 2:
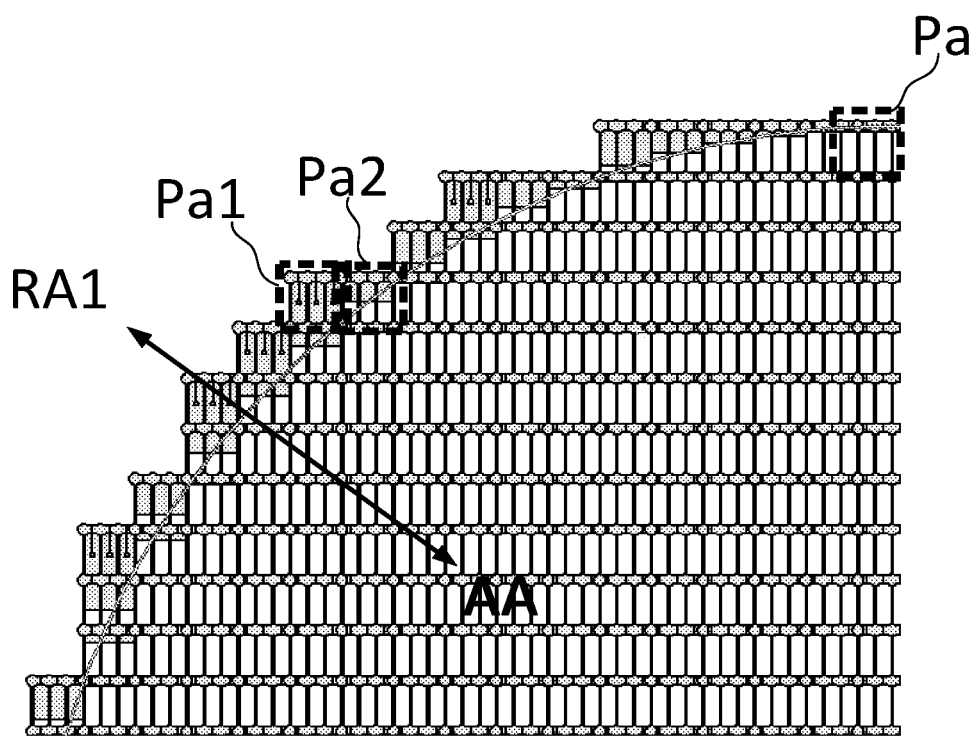
FIG. 2 is a schematic diagram showing an arrangement of pixels and display effect in a bent display region of a display panel according to the related art.
Figure 2:

In the related art, referring to FIG. 1, the display panel generally includes a display region and a peripheral area AS around the display region. The display region includes a central display region AA and bent display regions connected to edges of the central display region AA. The bent display regions may include, for example, rounded-corner display regions RA1 to RA4 in FIG. 1, or a bent display region RA5 at an edge of a camera shown in FIG. 1, or the like. Part (a) of FIG. 2 is a schematic diagram showing an arrangement of pixels in a bent display region RA1, and part (b) of FIG. 2 is a schematic diagram showing display effect in a bent display region in part (a) of FIG. 2. Referring to FIG. 2, each of the central display region AA and the bent display region RA1 is provided with a plurality of pixels Pa. In general, arc-shaped edges for bending display are formed in a gray-scale transition way such that the gray-scale luminance of the pixels in the bent display region RA1 gradually decreases in a direction from the central display region to a region away from the central display region. However in the display panel with low pixels per inch (PPI), since a size of the pixel is large and a distance between the pixels is large, the number of the pixels for gray-scale transition is small. For example, only two pixels Pa1 and Pa2 for gray-scale transition are located in the arc-shaped segment, therefore the span of the gray scale is large, thereby resulting in an obvious aliasing phenomenon and a poor gray-scale transition at the edges of the bent display regions.

In order to solve the above problem, in a first aspect, the present disclosure provides a display panel having a display region which includes a central display region and bent display regions connected to edges of the central display region. The central display region is provided with a plurality of first pixels, and the bent display region is provided with a plurality of second pixels. In the unit area, the number of the second pixels is greater than the number of the first pixels. In other words, the PPI of the bent display region is higher than the PPI of the central display region.

Figure 3:
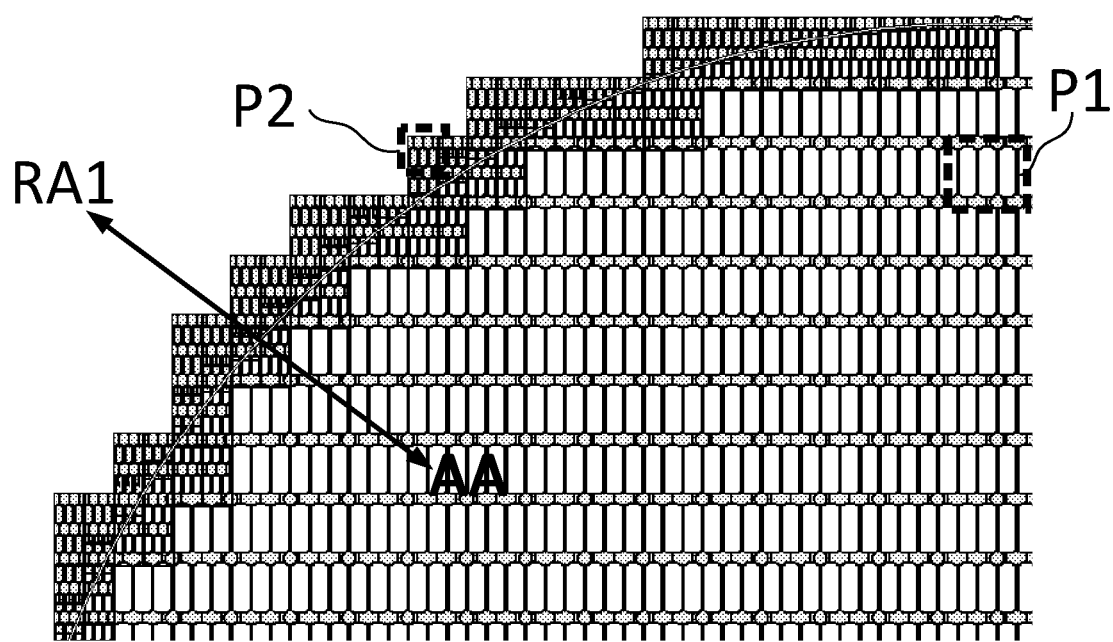
FIG. 3 is a schematic diagram showing an arrangement of pixels and display effect in a bent display region of a display panel according to an embodiment of the present disclosure.
Figure 3:
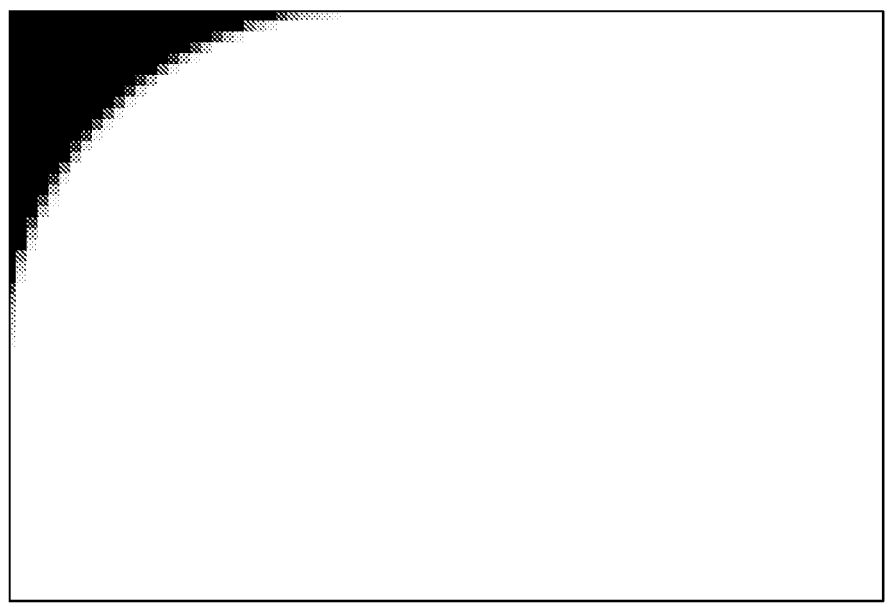

Specifically, referring to FIG. 3, part (a) of FIG. 3 is a schematic diagram showing a structure of a display panel in a boundary region between a bent display region RA1 and a central display region AA of a display panel according to an embodiment of the present disclosure. Part (b) of FIG. 3 shows a display effect in the bent display region of the display panel in part (a) of FIG. 3. It can be seen that a size or an area of a first pixel P1 located in the central display region AA is obviously greater than a size or an area of a second pixel P2 located in the bent display region RA1. As compared with the structure in part (a) of FIG. 2, since the number of a plurality of second pixels P2 for gray-scale transition in the bent display region RA1 increases, the plurality of second pixels P2 vary in brightness by different gray scales, the span of gray scale can be reduced, the aliasing phenomenon at the edge of the bent display region can be improved, thereby resulting a uniform gray-scale transition in the bent display region. As compared with part (b) of FIG. 2, the aliasing phenomenon at the edges of the display panel shown in part (b) of FIG. 3 of the present disclosure is obviously improved, and the transition of gray scale is smooth.

Figure 4:
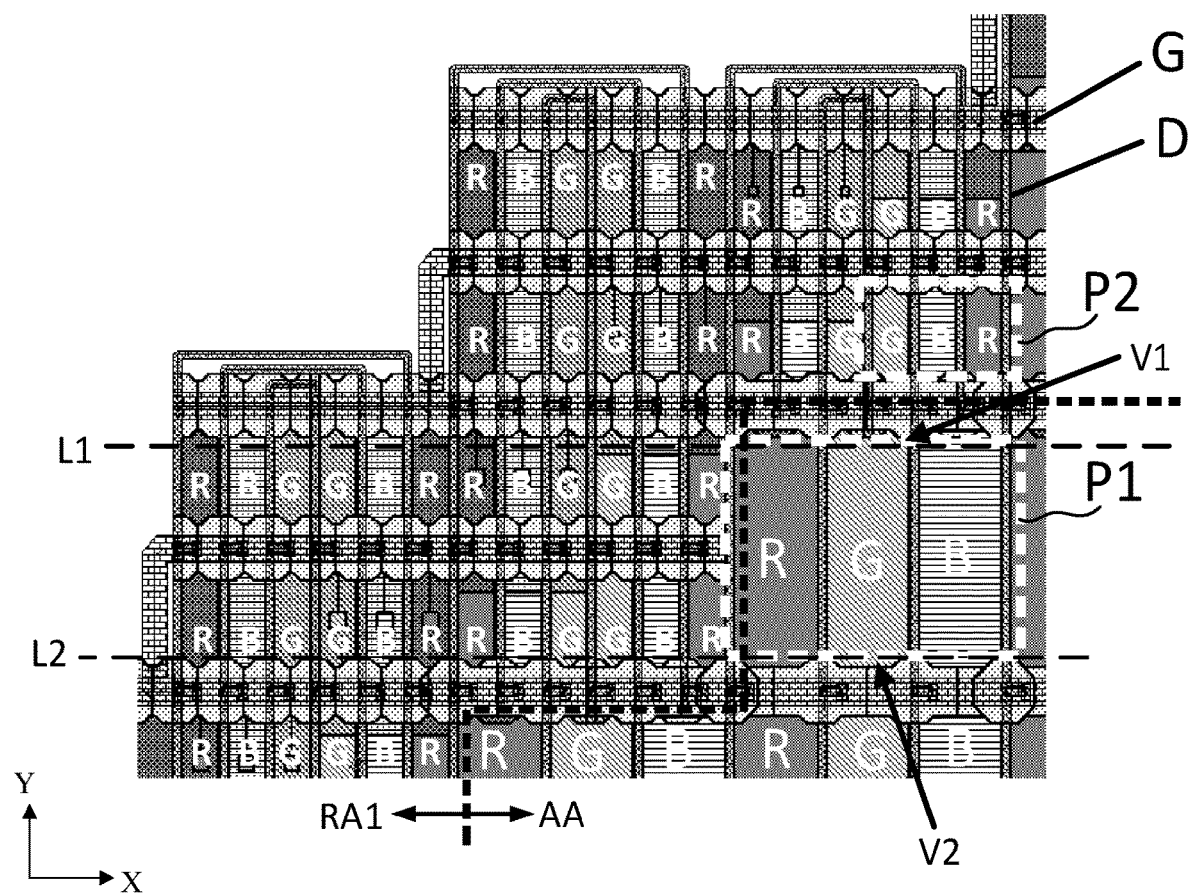
FIG. 4 is a first schematic diagram showing a planar structure of a portion of a display panel according to an embodiment of the present disclosure.
Figure 5:
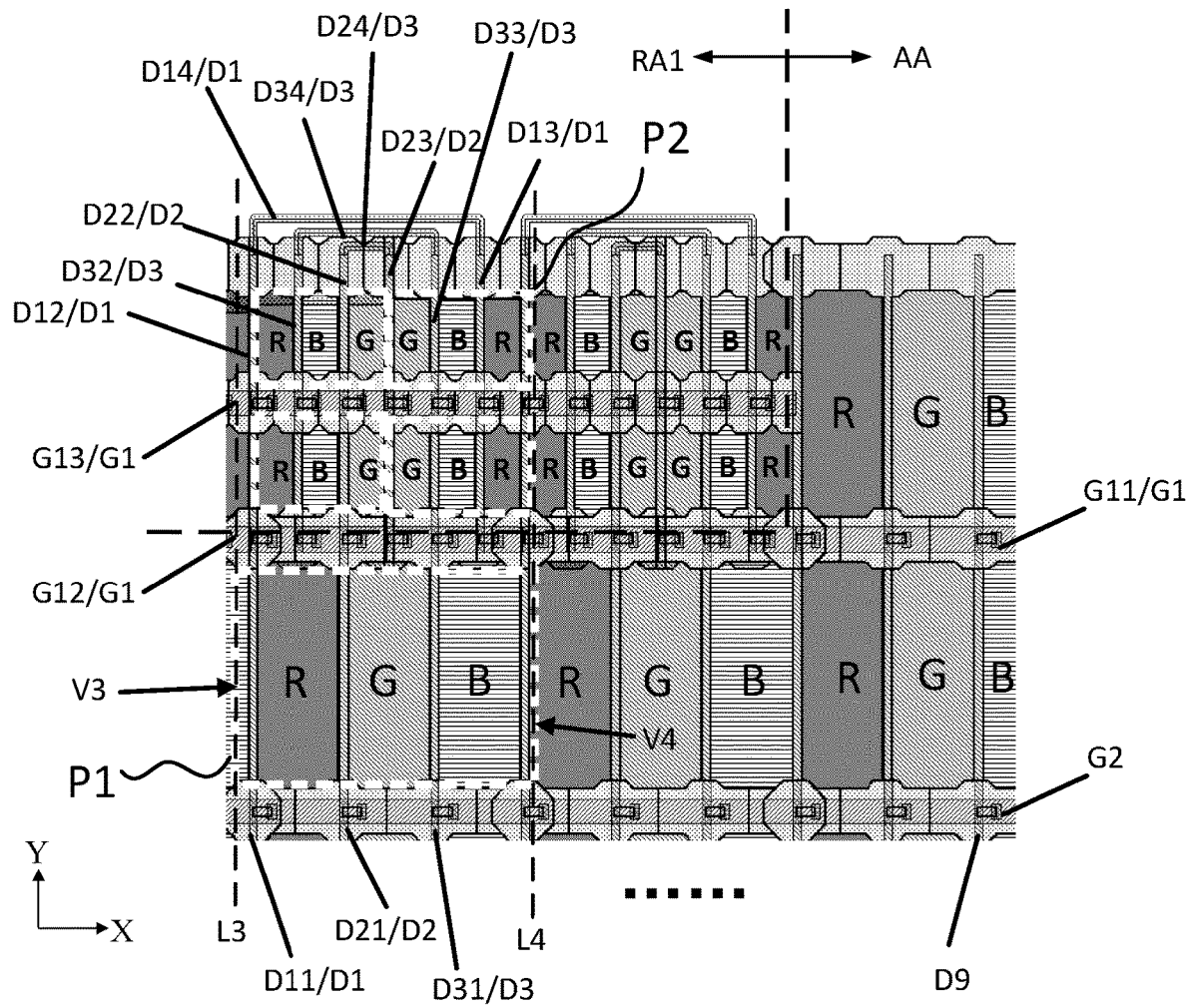
FIG. 5 is a second schematic diagram showing a planar structure of a portion of a display panel according to an embodiment of the present disclosure.
Figure 6:
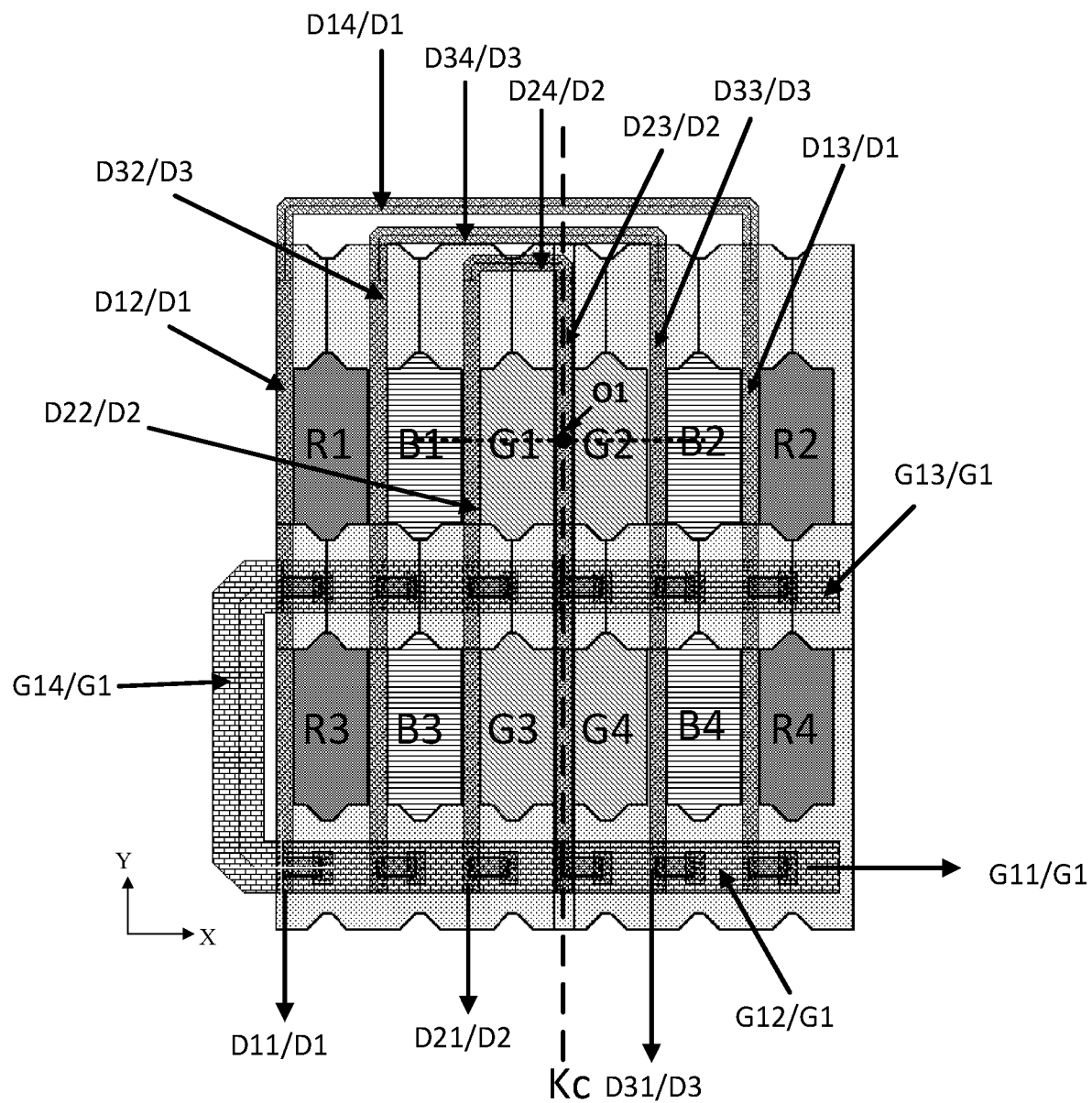
FIG. 6 is a third schematic diagram showing a planar structure of a portion of a display panel according to an embodiment of the present disclosure.

FIG. 4 to FIG. 6 are schematic diagrams showing a structure of a display panel in a boundary region between the bent display region RA1 and the central display region AA. FIG. 4 to FIG. 6 are schematic diagrams successively enlarged showing the structure of the display panel in order to facilitate showing the structure. In some examples, referring to FIG. 4 to FIG. 6, each of a plurality of first pixels P1 in the central display region AA includes multiple first sub-pixels in different colors. The plurality of first pixels P1 are arranged on the base substrate in an array along a row direction as a first direction X and a column direction as the second direction Y. The multiple first sub-pixels in each of the first pixels P1 are arranged in sequence along the first direction X.

Further, each of a plurality of second pixels P2 in the bent display region RA1 includes multiple second sub-pixels in different colors. The plurality of second pixels P2 are arranged in an array along a row direction as the first direction X and a column direction as the second direction Y. The multiple second sub-pixels in each of the second pixels P2 are arranged in sequence along the first direction X.

Based on the above pixel arrangement, an area occupied by one first sub-pixel in the central display region AA is the same as an area occupied by n×m second sub-pixels in the bent display regions RA1, where n, which is an integer greater than 1, is the number of the second sub-pixels arranged along the first direction X, and m, which is an integer greater than 1, is the number of the second sub-pixels arranged along the second direction Y. That is, in the bent display region RA1, it is equivalent to split one first sub-pixel into a plurality of small second sub-pixels arranged in an array, so that the area and shape of the pixel region defined by the first sub-pixel are the same as the area and shape of the total pixel region defined by the plurality of second sub-pixels arranged in an array, therefore the PPI in the bent display region RA1 is larger than the PPI in the central display region AA. Since more second pixels P2 may be arranged in the unit area of the bent display region RA1 and vary in brightness by different gray scales, so that the number of pixels (i.e., the second pixels P2) for gray-scale transition increases, the span of gray scale can be reduced, thereby resulting in a uniform gray-scale transition in the bent display region.

In some examples, in the central display region AA, a distance between any two adjacent first sub-pixels are the same, and a distance between any two adjacent first pixels are the same. In the bent display region RA1, a distance between any two adjacent second sub-pixels are the same, and a distance between any two adjacent second pixels are the same.

It should be noted that the first direction X intersects the second direction Y. Embodiments in which the first direction X is perpendicular to the second direction Y in the present disclosure will be described as examples.

It should be noted that, in the first sub-pixels in different colors and/or the second sub-pixels in different colors, the different colors include at least one of red R, blue B, green G, yellow Y, and white W. For convenience of description, embodiments in which the first pixel includes the first sub-pixels in three colors R, G, and B, and the second pixel includes the second sub-pixels in three colors R, G, and B will be described as examples, which does not limit the present disclosure.

In some examples, for two second pixels P2 adjacent in the first direction X, a line passing through a midpoint of a line segment connecting central points of the two second pixels P2 and extending in the second direction Y is referred to as a center line. The second sub-pixels, which are symmetrical about the center line, of the two second pixels P2 have the same color. For example, referring to FIG. 5, each of the second pixels P2 includes R, G, B second sub-pixels. Taking the embodiment in FIG. 6 in which the second pixels P2 are arranged in two rows and four columns as an example, the first second pixel P2 has three second sub-pixels in different colors R1, B1 and G1 as shown in FIG. 6, the second second pixel P2 has three second sub-pixels in different colors R2, B2 and G2 as shown in FIG. 6, the third second pixel P2 has three second sub-pixels in different colors R3, B3 and G3 as shown in FIG. 6, and the fourth second pixel P2 has three second sub-pixels in different colors R4, B4 and G4 as shown in FIG. 6. Taking the first second pixel P2 and the second second pixel P2 adjacent to each other as an example, a midpoint on the line segment connecting the center points of the first second pixel P2 and the second second pixel P2 is O1, and a line passing through O1 and extending in the second direction Y is the center line Kc. With the center line Kc as a symmetry axis, the second sub-pixels, which are symmetrical along the center line Kc, of the first second pixel P2 and the second pixel P2 have the same color. Specifically, along the directions from the center line Kc to the first second pixel P2 and the second second pixel P2 respectively, a first pair of second sub-pixels symmetrical to each other are green sub-pixels G1 and G2, a second pair of second sub-pixels symmetrical to each other are blue sub-pixels B1 and B2, and a third pair of second sub-pixels symmetrical to each other are red sub-pixels R1 and R2.

Further, with continued reference to FIG. 6, each of two second pixels P2 adjacent in the first direction X includes one second sub-pixel in first color, one second sub-pixel in second color, and one third sub-pixel in third color. The first color is red R, the second color is green G, and the third color is blue B. In this case, in the first second pixel P2 and second second pixel P2 adjacent to each other, both of the first second pixel P2 and second second pixel P2 include six second sub-pixels R1, B1, G1, G2, B2 and R2, and an arrangement sequence of the six second sub-pixels is: the second sub-pixel in the first color (e.g., R1 in FIG. 6), the second sub-pixel in the third color (e.g., B1 in FIG. 6), the second sub-pixel in the second color (e.g., G1 in FIG. 6), the second sub-pixel in the second color (e.g., G2 in FIG. 6), the second sub-pixel in the third color (e.g., B2 in FIG. 6), and the second sub-pixel in the first color (e.g., R2 in FIG. 6). In this way, when two adjacent second pixels P2 in the same color are connected to a data line during the subsequent process, the second sub-pixels in the same color of the two second pixels P2 may be connected to the same data line. The second sub-pixels are arranged in such a way that the second sub-pixels of the two adjacent second pixels P2 symmetrical along the center line Kc have the same color, each of the data lines may be sequentially connected to two second sub-pixels in the same color symmetrical about the center line Kc, so that the data lines may not intersect each other, and the data lines can be arranged simpler and easy for manufacture.

In some examples, with continued reference to FIG. 4 to FIG. 6, the area occupied by each of the first sub-pixels in the central display region AA is the same as the area occupied by 2×2 second sub-pixels in the bent display regions RA1, i.e., n=m=2. Each of the second pixels P2 includes one second sub-pixel in first color, one second sub-pixel in second color, and one second sub-pixel in third color. The first color, the second color, and the third color are red R, green G, and blue B, respectively. Each of the second sub-pixels has the same area, and each of the first sub-pixels has the same area. In this way, it is equivalent to split each of the first sub-pixels into four second sub-pixels. In the case that each of the first pixels P1 includes three first sub-pixels R, G, B, the area occupied by each of the first pixels P1 equals to the area occupied by four second pixels P2. In other words, in the bent display region RA1, the area of a single second pixel is decreased to one fourth of the area of a single pixel in the central display region AA, and the PPI of the second pixels in the bent display region RA1 increases to four times that of central display region AA. The four second pixels P2 vary in brightness by different gray scales, thereby realizing a uniform gray-scale transition. In existing technical scheme, the area of the second pixel P2 is the same as the area of the first pixel P1, only one second pixel for gray-scale transition is provided, resulting in a large span of gray scale. In contrast in the present disclosure, the number of the second pixels P2 for gray-scale transition in the display panel increases, the span of gray scale can be reduced, a uniform gray-scale transition can be obtained, and the aliasing phenomenon at the edge of the bent display region can be improve.

In some examples, referring to FIG. 4, the display panel includes a plurality of gate lines G extending in the first direction X and spaced apart from each other and a plurality of data lines G extending in the second direction Y and spaced apart from each other.

In some examples, with continued reference to FIG. 4 to FIG. 6, for each row of first pixels P1, the first sub-pixels in each row of first pixels P1 are connected to the same gate line. As shown in FIG. 44, a region defined by a first connection line L1 and a second connection line L2 is provided with n rows of second pixels P2, wherein first connection line L1 is on a first side V1 of the first sub-pixels of the row of first pixels P1, and second connection line L2 is on a second side V2 of the first sub-pixels of the row of first pixels P1. A gate line connected to the first sub-pixels of the row of first pixels P1 extends to the bent display region RA1 and connected to the second sub-pixels of the n rows of second pixels P2. Each of the first connection line L1 and the second connection line L2 extends along the first direction X, and the first side V1 is opposite to the second side V2. In FIG. 4, the first side V1 is an upper side of the first pixels P1, and the second side V2 is a lower side of the first pixels P1. since the second sub-pixels of the plurality of rows of second pixels P2 are connected to the gate line to which the row of first pixels P1 in the central display region AA is connected, thereby avoiding an increase of the number of the gate lines of the display panel, and avoiding an adverse impact on the design of peripheral circuit of the display panel.

In some examples, with continued reference to FIG. 4 to FIG. 6, in the case of n=2, that is, as shown in FIG. 4, in the case where the region defined by the first connection line L1 and the second connection line L2 is provided with two rows of second pixels P2 wherein the first connection line L1 is on the first side V1 of the first sub-pixels of a row of first pixels P1 and the second connection line L2 is on the second side V2 of the first sub-pixels of a row of first pixels P1, FIG. 5 and FIG. 6 show a gate line G1 and a gate line G2, wherein the gate line G1 extends to the bent display region RA1. Taking the gate line G1 as an example, the gate line G1 includes a first gate sub-line G11, a second gate sub-line G12, a third gate sub-line G13 that extend along the first direction X, and a first connection line G14 extending along the second direction Y. For the first sub-pixels in a row of first pixels P1, the first sub-pixels in the row of first pixels P1 are connected to the first gate sub-line G11 located in the central display region AA. A first row of second pixels P2 of two rows of second pixels P2 corresponding to the row of first sub-pixels P1 are connected to the second gate sub-line G12 located in the bent display region RA1. A second row of second pixels P2 of the two rows of second pixels P2 are connected to the third gate sub-line G13 located in the bent display region RA1. The first connection line G14 is located on a side of the first row of second pixels P2 away from the central display region AA. Specifically, a first end of one of the second gate sub-line G12 and the third gate sub-line G13 is connected to a first end of the first gate sub-line G11, a second end of the one of the second gate sub-line G12 and the third gate sub-line G13 is connected to a first end of the first connection line G14, a second end of the first connection line G14 is connected to a first end of the other of the second gate sub-line G12 and the third gate sub-line G13. The second sub-pixels in the two rows of second pixels P2 are connected to a gate line to which a row of first pixels P1 in the central display region AA are connected, thereby avoiding an increase of the number of the gate lines of the display panel, and avoiding an adverse impact on the design of peripheral circuit of the display panel.

It should be noted that the plurality of rows of second pixels P2 corresponding to one row of first sub-pixels P1 refers to a plurality of rows of second pixels P2 are provided in a region defined by the first connection line L1 and the second connection line L2, wherein the first connection line L1 is on the first side V1 of the first sub-pixels of the row of first sub-pixels P1, and the second connection line L2 is on the second side V2 of the first sub-pixels of the row of first sub-pixels P1.

In some examples, referring to FIG. 5 and FIG. 6, for each column of first pixels P1, each column of first pixels P1 include k columns of first sub-pixels in different colors, k being an integer greater than 2. Each column of first sub-pixels are connected to a corresponding data line. The first sub-pixels connected to the same data line have the same color. For k columns of first sub-pixels in each column of first pixels, the $1^{st}$ column to the $k^{th}$ column of first sub-pixels are spaced apart from each other along the first direction X. A region defined by a third connection line L3 and a fourth connection line L4 is provided with k×m columns of second sub-pixels, wherein the third connection line L3 is on a third side V3 of the first column of first sub-pixels away from the $k^{th}$ column of first sub-pixels, and the fourth connection line L4 is on a fourth side V4 of the $k^{th}$ column of first sub-pixels away from the first column of first sub-pixels. It should be noted that as described above, the area of each first sub-pixel is equal to the area of second sub-pixels arranged in n rows and m columns. It can be know from above that the region defined by the third connection line L3 on the third side and the fourth connection line L4 on the fourth side of each column of first sub-pixels is provided with m columns of second sub-pixels. The $1^{st}$ column and the $k^{th}$ column of first sub-pixels are two columns of first sub-pixels outermost in the first direction X of one column of first pixels P1. A data line connected to any one of k columns of first sub-pixels extends to the bent display region RA1 and is connected to m columns of second sub-pixels that are in the same color as the column of first sub-pixels. The third connection line L3 and the fourth connection line L4 extend along the second direction Y, the third side V3 is opposite to the fourth side V4. In FIG. 5, the third side V3 is a left side of the first column of first sub-pixels R, and the fourth side V4 is a right side of the third column of first sub-pixels B. The second sub-pixels of the plurality of rows of second pixels P2 are connected to one gate line to which a row of first pixels P1 in the central display region AA are connected, thereby avoiding an increase of the number of the gate lines of the display panel, and avoiding an adverse impact on the design of peripheral circuit of the display panel.

In some examples, in case of k=3 and m=2, that is, as shown in FIG. 5, each column of first pixels includes three columns of first sub-pixels, for example, a column of first sub-pixels in first color, a column of first sub-pixels in second color, and a column of first sub-pixels in third color. The first color, the second color and the third color are red R, green G and blue B, respectively. The arrangement sequence for the first sub-pixels are the first sub-pixel in red R, the first sub-pixel in green G, and the first sub-pixel in blue B. According to the above description in conjunction with FIG. 5 and FIG. 6, the area of each of the first sub-pixels is equivalent to the area of the second sub-pixels arranged in two rows and two columns. It can be seen from above that the region defined in the bent display region RA1 by the third connection line on the third side and the fourth connection line on the fourth side of each column of first sub-pixels is provided with two columns of second pixels. The region defined in the bent display region RA1 by the third connection line L3 and the fourth connection line L4 is provided with 3×2 columns of second pixels, wherein the third connection line L3 is on the third side V3 of the first column of first sub-pixels away from the third columns of first sub-pixels of each column of first pixels, and the fourth connection line L4 is on the fourth side V4 of the third column of first sub-pixels away from the first columns of first sub-pixels of each column of first pixels. Each column of second pixels P2 includes one column of second sub-pixels P2 in red R, one column of second sub-pixels P2 in green G, and one column of second sub-pixels P2 in blue B. Six columns of second sub-pixels in the region defined in the bent display region RA1 by the fourth connection line L3 of the fourth side V4 are included in two adjacent columns of second pixels P2 respectively. The arrangement sequence for the six columns of second sub-pixels is the second sub-pixel in first color, the second sub-pixel in third color, the second sub-pixel in second color, the second sub-pixel in second color, the second sub-pixel in third color, and the second sub-pixel in first color. The first color, the second color and the third color are red R, green G and blue B, respectively. The arrangement sequence for the six columns of second sub-pixels is RGBBGR.

Based on the above arrangement, with continued reference to FIG. 5 and FIG. 6, for the 3 columns of first sub-pixels arranged in RGB of a column of first pixels P1, the data line (e.g., D1 in FIG. 5) connected to the first sub-pixel R extends to the bent display region RA1 and is connected two columns of second sub-pixels R of the six columns of second sub-pixels. The data line (e.g., D2 in FIG. 5) connected to the first sub-pixel G extends to the bent display region RA1 and is connected to two columns of second sub-pixels G of the six columns of second sub-pixels. The data line (e.g., D3 in FIG. 5) connected to the first sub-pixel B extends to the bent display region RA1 and is connected to two columns of second sub-pixels B of the six columns of second sub-pixels. Both of a column of first sub-pixels and the columns of second sub-pixels that have the same color as the column of first sub-pixels are connected to the same data line, thereby avoiding an increase of the number of the data lines of the display panel, and avoiding an adverse impact on the design of peripheral circuit of the display panel. In combination with the arrangement of the gate lines, the second sub-pixel connected to the same gate line and the same data line may be simultaneously lightened.

Further, according to the above arrangement, the data line includes a first data sub-line, a second data sub-line, and a third data sub-line extending along the second direction Y, and a second connection line extending along the first direction X. For three columns of first sub-pixels of one column of first pixels, a column of first sub-pixels in any color is connected to the first data sub-line in the central display region AA, and two columns of second sub-pixels in the same color corresponding to the column of first sub-pixels are respectively connected to the second data sub-line and the third data sub-line in the bent display region RA1. The second connection line is on a side of the two columns of second sub-pixels in the same color away from the central display region AA. A first end of one of the second data sub-line and the third data sub-line is connected to a first end of the first data sub-line, a second end of the one of the second data sub-line and the third data sub-line is connected to a first end of the second connection line, and a second end of the second connection line is connected to a first end of the other of the second data sub-line and the third data sub-line. For example, FIG. 5 and FIG. 6 show nine data lines D1 to D9. Taking the data line D1, the data line D2 and the data line D3 as an example, the data line D1 includes a first data sub-line D11, a second data sub-line D12, a third data sub-line D13 and a second connection line D14. The first data sub-line D11 is connected to the first sub-pixel in red. The second data sub-line D12 is connected to a column of second sub-pixels in red of the first column of second pixels. The third data line D13 is connected to a column of second sub-pixels in red of the second column of second pixels. A first end of the second data sub-line D12 is connected to a first end of the first data sub-line D11, a second end of the second data sub-line D12 is connected to a first end of the second connection line D14, and a second end of the second connection line D14 is connected to a first end of the third data sub-line D113. Similarly, the data line D2 includes a first data sub-line D21, a second data sub-line D22, a third data sub-line D23 and a second connection line D24. The first data sub-line D21 is connected to the first sub-pixels in green, the second data sub-line D22 is connected to a column of second sub-pixels in green of the first column of second pixels, the third data line D23 is connected to a column of second sub-pixels in green of the second column of second pixels. A first end of the second data sub-line D22 is connected to a first end of the first data sub-line D21, a second end of the second data sub-line D22 is connected to a first end of the second connection line D24, and a second end of the second connection line D24 is connected to a first end of the third data sub-line D23. The data line D3 includes a first data sub-line D31, a second data sub-line D32, a third data sub-line D33 and a second connection line D34. The first data sub-line D31 is connected to the first sub-pixels in blue, the second data sub-line D32 is connected to a column of second sub-pixels in blue of the first column of second pixels, the third data line D33 is connected to a column of second sub-pixels in blue of the second column of second pixels. A first end of the third data sub-line D33 is connected to a first end of the first data sub-line D31, a second end of the third data sub-line D33 is connected to a first end of the second connection line D34, and a second end of the second connection line D34 is connected to a first end of the second data sub-line D32. Orthographic projections of the data lines (e.g., the first data sub-line, the second data sub-line, the third data sub-line, and the second connection line) on the display panel do not overlap each other.

It should be noted that a column of first sub-pixels P1 corresponding to a plurality of columns of second pixels P2 refers to that the region defined in the bent display region RA1 by the third connection line L3 and the fourth connection line L4 of the column of first sub-pixels P1 is provided therein with the plurality of columns of second pixels P2.

Figure 7:
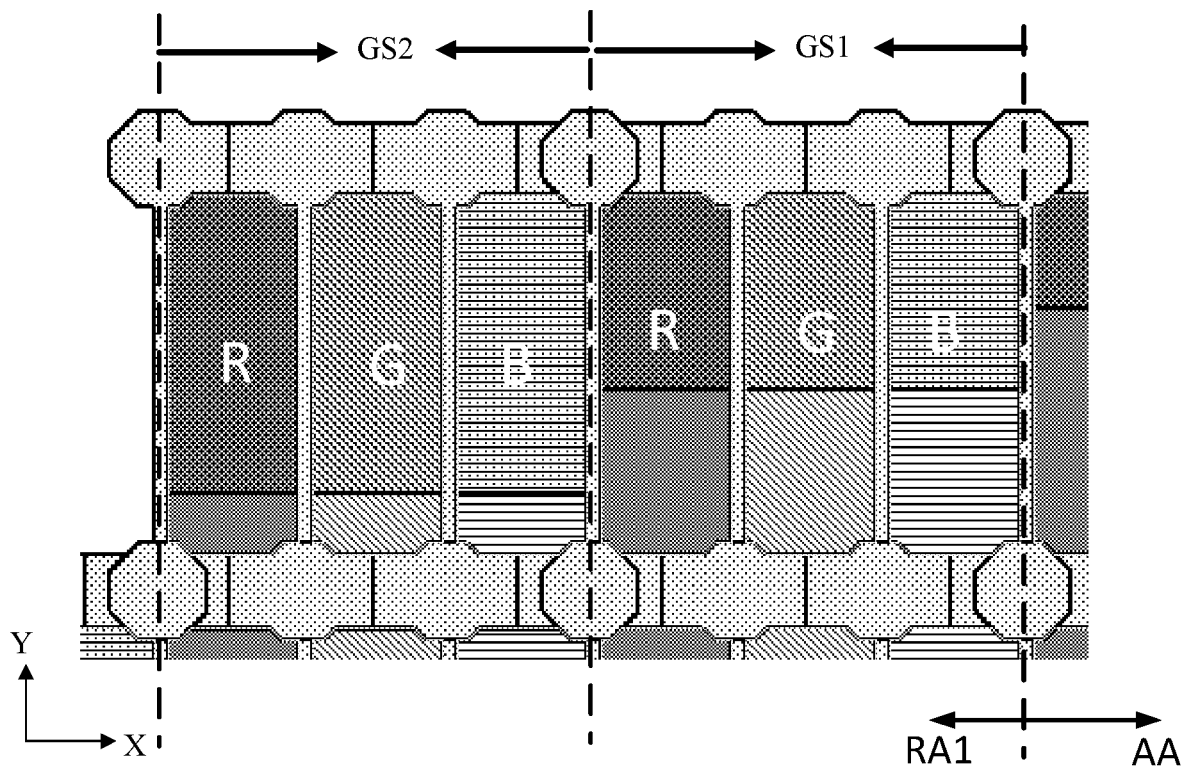
FIG. 7 is a schematic diagram showing a gray-scale transition in a bent display region of a display panel according to the related art.
Figure 8:
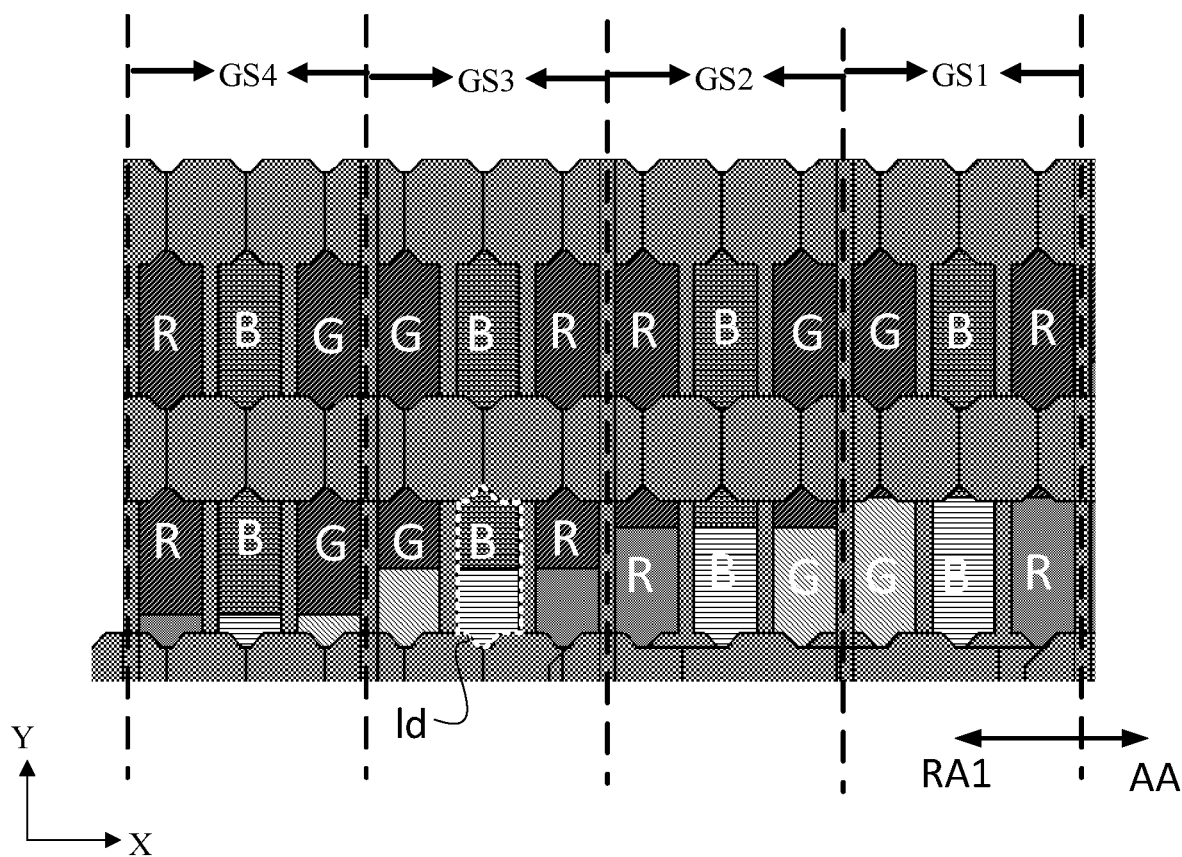
FIG. 8 is a schematic diagram showing a gray-scale transition in a bent display region of a display panel according to an embodiment of the present disclosure.

In some examples, for the second pixels in the display panel, the gray-scale luminance of the first pixel or the second pixel is determined by the aperture ratio of the pixel region of the second pixel. The higher the aperture ratio is, the greater the gray-scale luminance is. In a case wherein the pixels have the same area, the higher the aperture ratio of the first pixel or the second pixel is, the larger the aperture area is. Referring to FIG. 7 and FIG. 8, FIG. 7 is a schematic diagram showing a gray-scale transition in a bent display region of a display panel according to the related art, and FIG. 8 is a schematic diagram showing a gray-scale transition in a bent display region of a display panel according to an embodiment of the present disclosure. FIG. 8 shows the second pixels arranged in two rows and four columns. The aperture ratio of each of the second pixels is an average value of the aperture ratios of three second sub-pixels of the second pixel. That is, the aperture ratio of each of the second sub-pixels=(the area of the pixel region minus the area of the light-shielding region)/the area of the pixel region %, and the same computing method of the aperture ratio may be applied to the first pixel. Accordingly, the aperture area of each of the second sub-pixels equals to the area of the pixel region minus the area of the light-shielding region, and the same computing method of the aperture ratio may be applied to the first pixel. The reference character ld in FIG. 8 shows a pixel region of one second sub-pixel, and the area of the light-shielding region is a darker portion of the pixel region. With continued reference to FIG. 8, in the present disclosure, an aperture area of the second pixel P2 is smaller than an aperture area of the first pixel P1. In the first direction X, the farther the second pixel P2 is from the first pixel P1, the smaller the aperture area of the second pixel P2 is, so as to form a grayscale transition in the first direction. In the second direction Y, the farther the second pixel P2 is from the first pixel structure P1, the smaller the aperture area of the second pixel P2 is, so as to form a grayscale transition in the second direction Y. The gray-scale luminance ranges from 0 to 255. The aperture ratio and gray-scale luminance of the second pixel are calculated as follows:

$$\text{Aperture ratio} = (\text{a value of the gray-scale luminance}/255)^{2.2}$$

For example, a value of the gray-scale luminance is 250, and the aperture ratio is $(250/255)^{2.2}=95.74\%$.

Comparing FIG. 7 and FIG. 8, in the display panel in related art, an arc-shaped bent display region RA1 has two second pixels P2 in the first direction X, and the gray-scale luminances of the two second pixels P2 are the first gray-scale GS1 and the second gray-scale GS2, respectively, wherein GS1=179, and GS2=112, with the gray-scale luminance of the first pixel P1 in the central display region AA being 255. Only two second pixels P2 for gray-scale transition from 255 to 112 are formed in the bent display region RA1, resulting in a large span of gray scale and a uniform gray-scale transition. However in the display panel of the present disclosure, 2×4 second pixels P2 are formed in the pixel region having the same area as the pixel region shown in FIG. 7. The gray-scale luminances of the four columns of second pixels P2 are a first gray-scale GS1, a second gray-scale GS2, a third gray-scale GS3 and a fourth gray-scale GS4, respectively, wherein GS1=253, GS2=228, GS3=185, GS4=112, with the gray-scale luminance of the first pixel P1 in the central display region AA being 255. Four second pixels P2 for gray-scale transition from 255 to 112 are formed in the bent display region RA1, that is the number of pixels for gray-scale transition is increased, resulting in a small span of gray scale, a uniform gray-scale transition, and an improved aliasing phenomenon at the edges of the bent display regions.

In some examples, the display panel further includes a light-shielding layer on a light-emitting side of the second pixels and the first pixels. For example, the dark portion of the pixel region in FIG. 8 is a portion covered by the light-shielding layer. The light-shielding layer further covers the gate lines and the data lines. In the first direction X, the farther the second pixel P2 is from the first pixel P1, the larger the area of the light-shielding layer in the pixel region of the second pixel P1 is, and the lower the aperture ratio of the second pixel P1 is. In the second direction Y, the farther the second pixel P2 is from the first pixel structure P1, the larger the area of the light-shielding layer in the pixel region of the second pixel P2 is, and the lower the aperture ratio of the second pixel P2 is. By controlling a ratio of the area of the pixel region covered by the light-shielding layer to the total area of the pixel region, the aperture rate of the second pixel P2 can be controlled, and in turn the gray-scale luminance of the second pixel P2 can be controlled.

In some examples, the second sub-pixels in the same second pixel P2 have the same aperture area. Similarly, the first sub-pixels in the same first pixel P1 have the same aperture area, so as to avoid color deviation of display panel.

In some examples, the bent display region may be a display region of any shape having a bent edge. For example, the bent display region may be at least one of a rounded-corner display region, a chamfer display region, or an arc display region.

In a second aspect, the present disclosure further provides a display device including the above display panel. The display device can be any product or component with a display function, such as a mobile phone, a tablet computer, a television, a display, a notebook computer, a digital photo frame, a navigator and the like. Other essential components of the display panel are understood by those skilled in the art, and are not described herein nor should they be construed as limiting the present disclosure.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and essense of the present disclosure, and these changes and modifications are to be considered within the scope of the present disclosure.

What is claimed is:

1. A display panel comprising a central display region and a bent display region at an edge of the central display region; wherein the central display region is provided therein with a plurality of first pixels, and the bent display region is provided therein with a plurality of second pixels; wherein
   a number of the second pixels in a unit area is greater than a number of the first pixels in the unit area, wherein
   each of the plurality of first pixels comprises a plurality of first sub-pixels in different colors, and each of the plurality of second pixels comprises a plurality of second sub-pixels in different colors,
   the plurality of first pixels are arranged in an array along a row direction as a first direction and a column direction as a second direction, the plurality of first sub-pixels in each of the first pixels are arranged in sequence along the first direction, with the first direction intersecting the second direction,
   the plurality of second pixels are arranged in an array along the row direction as the first direction and the column direction as the second direction, the plurality of second sub-pixels in each of the second pixels are arranged in sequence along the first direction, and
   an area occupied by each of the first sub-pixels is the same as an area occupied by n×m second sub-pixels, where n is a number of the second sub-pixels arranged in the first direction, m is a number of the second sub-pixels arranged in the second direction, with n being an integer greater than 1 and m being an integer greater than 1.

2. The display panel of claim 1, wherein
   a line passing through a midpoint of a line segment connecting central points of two second pixels adjacent in the first direction and extending in the second direction is a center line, and
   the second sub-pixels of the two second pixels symmetrical about the center line have a same color.

3. The display panel of claim 2, wherein
   n=m=2, and
   each of the second pixels comprises one second sub-pixel in a first color, one second sub-pixel in a second color, and one second sub-pixel in a third color.

4. The display panel of claim 3, wherein an arrangement sequence for the six second sub-pixels of two second pixels adjacent in the first direction is the second sub-pixel in the first color, the second sub-pixel in the third color, the second sub-pixel in the second color, the second sub-pixel in the second color, the second sub-pixel in the third color, and the second sub-pixel in the first color.

5. The display panel of claim 1, further comprising a plurality of gate lines extending in the first direction and spaced apart from each other; wherein
the first sub-pixels of one row of first pixels are connected to a corresponding one of the gate lines,
a region defined in the bent display region by a first connection line on a first side and a second connection line on a second side of the first sub-pixels of the row of first pixels is provided therein with n rows of second pixels,
the gate line connected to the first sub-pixels of the row of first pixels extends to the bent display region and is connected to the second sub-pixels of the n rows of second pixels, with each of the first connection line and the second connection line extending along the first direction, and the first side is opposite to the second side.

6. The display panel of claim 5, wherein n=2, one of the gate lines comprises a first gate sub-line, a second gate sub-line, a third gate sub-line extending in the first direction, and a first connection line extending in the second direction,
the first sub-pixels of one row of first pixels are connected to the first gate sub-line in the central display region, the second sub-pixels of two rows of second pixels corresponding to the row of first pixels are respectively connected to the second gate sub-line and the third gate sub-line in the bent display region, and the first connection line is on a side of the two rows of second pixels away from the central display region,
a first end of one of the second gate sub-line and the third gate sub-line is connected to a first end of the first gate sub-line, a second end of the one of the second gate sub-line and the third gate sub-line is connected to a first end of the first connection line, and a second end of the first connection line is connected to a first end of the other of the second gate sub-line and the third gate sub-line.

7. The display panel of claim 2, further comprising a plurality of data lines extending in the second direction and spaced apart from each other; wherein
each column of first pixels comprises k columns of first sub-pixels in different colors, k being an integer larger than 2, the first sub-pixels in each of the k columns of first sub-pixels are connected to a corresponding one of the plurality of data lines, and the first sub-pixels connected to a same data line have a same color,
a region defined in the bent display region by a third connection line and a fourth connection line is provided therein with k×m columns of second sub-pixels, wherein the third connection line is on a third side of a 1$^{st}$ column of first sub-pixels away from a k$^{th}$ column of first sub-pixels among the k columns of first sub-pixels of the one column of first pixels, and the fourth connection line is on a fourth side of the k$^{th}$ column of first sub-pixels away from the 1$^{st}$ column of first sub-pixels, and
the data line connected to any one of the k columns of first sub-pixels extends to the bent display region and is connected to m columns of second sub-pixels in the same color as the column of first sub-pixels, with each of the third connection line and the fourth connection line extending along the second direction and the third side being opposite to the fourth side.

8. The display panel of claim 7, wherein k=3, m=2, each column of first pixels comprises one column of first sub-pixels in a first color, one column of first sub-pixels in a second color, and one column of first sub-pixels in a third color arranged in an order of the first sub-pixel in the first color, the second color in the first sub-pixel, and the first sub-pixel in the third color;
each column of second pixels comprises one column of second sub-pixels in the first color, one column of second sub-pixels in the second color, and one column of second sub-pixels in the third color, and an arrangement sequence of six columns of second sub-pixels in two adjacent columns of second pixels is the second sub-pixel in the first color, the second sub-pixel in the third color, the second sub-pixel in the second color, the second sub-pixel in the second color, the second sub-pixel in the third color, and the second sub-pixel in the first color,
a region defined in the bent display region by a third connection line and a fourth connection line is provided therein with six columns of second sub-pixels of two adjacent columns of second pixels, wherein the third connection line is on a third side of the first sub-pixel in the first color away from the first sub-pixel in the third color among the three columns of first sub-pixels of one column of first pixels, and the fourth connection line is on a fourth side of the first sub-pixel in the third color away from the first sub-pixel in the first color, and
among the three columns of first sub-pixels of the one column of first pixels, the data line connected to the first sub-pixels in the first color extends to the bent display region and is connected to two columns of second sub-pixels in the first color of the six columns of second sub-pixels, the data line connected to the first sub-pixels in the second color extends to the bent display region and is connected to two columns of second sub-pixels in the second color of the six columns of second sub-pixels, and the data line connected to the first sub-pixel in the third color extends to the bent display region and is connected to two columns of second sub-pixels in the third color of the six columns of second sub-pixels.

9. The display panel of claim 8, wherein one of the data lines comprises a first data sub-line, a second data sub-line, a third data sub-line extending in the second direction, and a second connection line extending in the first direction,
among three columns of first sub-pixels of one column of first pixels, the first sub-pixels in one column of first sub-pixels in any color are connected to the first data sub-line in the central display region, and two columns of second sub-pixels in a same color corresponding to the column of first sub-pixels are respectively connected to the second data sub-line and the third data sub-line in the bent display region; the second connection line is on a side of the two columns of second sub-pixels in the same color away from the central display region,
a first end of one of the second data sub-line and the third data sub-line is connected to a first end of the first data sub-line, a second end of the one of the second data sub-line and the third data sub-line is connected to a first end of the second connection line, and a second end of the second connection line is connected to a first end of the other of the second data sub-line and the third data sub-line.

10. The display panel of claim 1, wherein
an aperture area of the second pixel is smaller than an aperture area of the first pixel;
the farther the second pixel is from the first pixel along the first direction, the smaller the aperture area of the second pixel is, and
the farther the second pixel is from the first pixel along the second direction, the smaller the aperture area of the second pixel is.

11. The display panel of claim 10, further comprising a light shielding layer covering a light-emitting side of the second pixel and the first pixel, wherein
the farther the second pixel is from the first pixel along the first direction, the larger the area of the light shielding layer in the pixel region of the second pixel is, and
the farther the second pixel is from the first pixel along the second direction, the larger the area of the light shielding layer in the pixel region of the second pixel is.

12. The display panel of claim 1, wherein the second sub-pixels of each of the second pixels have a same aperture area.

13. The display panel of claim 1, wherein the bent display region comprises at least one of a fillet display region, a chamfer display region, and an arc-shaped display region.

14. A display device comprising the display panel of claim 1.

* * * * *